United States Patent
Nguyen et al.

(10) Patent No.: US 9,866,172 B2
(45) Date of Patent: Jan. 9, 2018

(54) HOLLOW SUPPORTS AND ANCHORS FOR MECHANICAL RESONATORS

(71) Applicant: THE REGENTS OF THE UNIVERSITY OF CALIFORNIA, Oakland, CA (US)

(72) Inventors: Clark T.-C. Nguyen, Oakland, CA (US); Lingqi Wu, Albany, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 903 days.

(21) Appl. No.: 14/228,645

(22) Filed: Mar. 28, 2014

(65) Prior Publication Data

US 2016/0164458 A1   Jun. 9, 2016

Related U.S. Application Data

(63) Continuation of application No. PCT/US2012/061221, filed on Oct. 19, 2012.
(Continued)

(51) Int. Cl.
*H01P 7/10* (2006.01)
*H03B 1/02* (2006.01)
(Continued)

(52) U.S. Cl.
CPC .......... *H03B 1/02* (2013.01); *G01C 19/5698* (2013.01); *G01C 19/5712* (2013.01);
(Continued)

(58) Field of Classification Search
CPC ............ G01C 19/5733; G01C 19/5698; G01C 19/5712; H03B 1/02; H03B 5/30;
(Continued)

(56) References Cited

U.S. PATENT DOCUMENTS 6,628,177 B2   9/2003   Clark et al.
9,383,271 B2 *  7/2016   Ojima .................... G01L 1/22
(Continued)

FOREIGN PATENT DOCUMENTS

WO   2013/059749 A1   4/2013

OTHER PUBLICATIONS

Korean Intellectual Property Office (KIPO), International Search Report and Written Opinion, dated Mar. 29, 2013, for corresponding International Patent Application No. PCT US2012/061221 (pp. 1-9) and claims (pp. 10-13) pp. 1-13.
(Continued)

*Primary Examiner* — Arnold Kinkead
(74) *Attorney, Agent, or Firm* — O'Banion & Ritchey LLP; John P. O'Banion

(57) ABSTRACT

A micromechanical resonator having one or more anchoring stems which are hollow to increase resonator Q factor. By way of example a micromechanical disk resonator embodiment is shown utilizing a resonant micromechanical disk anchored by a stem between at least one electrode used for input and output. To increase resonator Q, a hollow stem is utilized in which an outer thickness of stem material surrounds a hollow area interior of the stem, or that is fabricated with a plurality of vias and/or fabricated substructures containing hollow spaces in the stem material. Measurements have confirmed that Q values can be increased using the hollow core stems by a factor of 2.9 times in certain implementations and operating modes.

33 Claims, 17 Drawing Sheets

Related U.S. Application Data

(60) Provisional application No. 61/549,420, filed on Oct. 20, 2011.

(51) Int. Cl.

| | | |
|---|---|---|
| *H01P 1/39* | (2006.01) | |
| *H03B 5/18* | (2006.01) | |
| *H03H 9/54* | (2006.01) | |
| *G01C 19/5698* | (2012.01) | |
| *H01P 1/38* | (2006.01) | |
| *G01C 19/5712* | (2012.01) | |
| *H03H 3/007* | (2006.01) | |
| *G01C 19/5733* | (2012.01) | |
| *H03B 5/30* | (2006.01) | |
| *H03H 9/24* | (2006.01) | |
| *H03H 9/02* | (2006.01) | |

(52) U.S. Cl.
CPC ............ *G01C 19/5733* (2013.01); *H01P 1/38* (2013.01); *H01P 1/39* (2013.01); *H01P 7/10* (2013.01); *H03B 5/1835* (2013.01); *H03B 5/30* (2013.01); *H03H 3/007* (2013.01); *H03H 9/2436* (2013.01); *H03H 9/54* (2013.01); *H03H 2009/0244* (2013.01); *H03H 2009/02346* (2013.01)

(58) Field of Classification Search
CPC ........ H03B 5/1835; H03H 3/007; H03H 9/54; H01P 1/38; H01P 1/39; H01P 7/10
USPC ......... 156/145; 73/504.13; 216/33; 333/199, 333/184
See application file for complete search history.

(56) References Cited

U.S. PATENT DOCUMENTS

| | | |
|---|---|---|
| 2005/0206479 A1 | 9/2005 | Nguyen et al. |
| 2008/0284544 A1 | 11/2008 | Hashimura |
| 2009/0115283 A1 | 5/2009 | Tripard et al. |
| 2009/0315644 A1 | 12/2009 | Sheedy et al. |
| 2011/0239763 A1* | 10/2011 | Shkel .................... B29C 44/022 73/504.13 |

OTHER PUBLICATIONS

Wang et al., "1.156-GHz Self-Aligned Vibrating Micromechanical Disk Resonator," IEEE Transactions on Ultrasonics, Ferroelectrics, and Frequency Control, vol. 51, No. 12, Dec. 2004, pp. 1607-1628.
Li et al., "Micromechanical "Hollow-Disk" Ring Resonators," Proceedings, 17th Int. IEEE Micro Electro Mechanical Systems Conf., Maastricht, The Netherlands, Jan. 25-29, 2004, pp. 821-824.

* cited by examiner

3rd Order Whispering Gallery Mode

Wine Glass Mode

6th Order Whispering Gallery Mode

Contour Mode

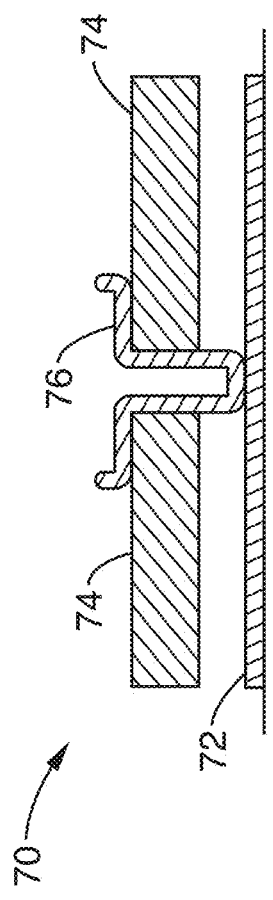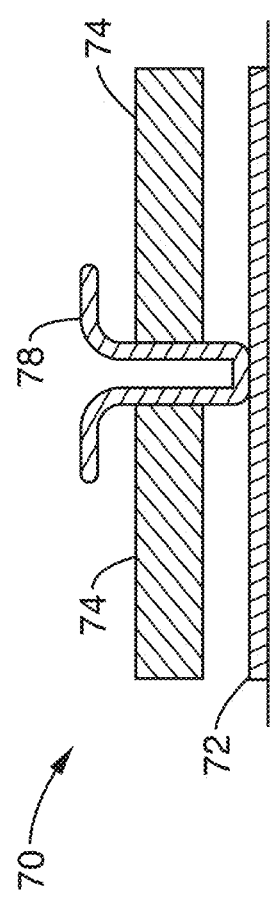

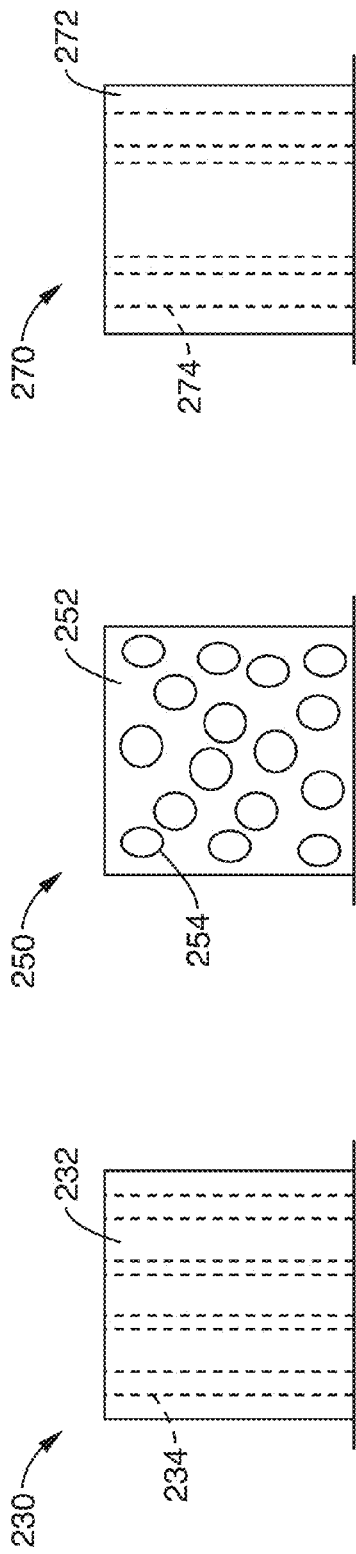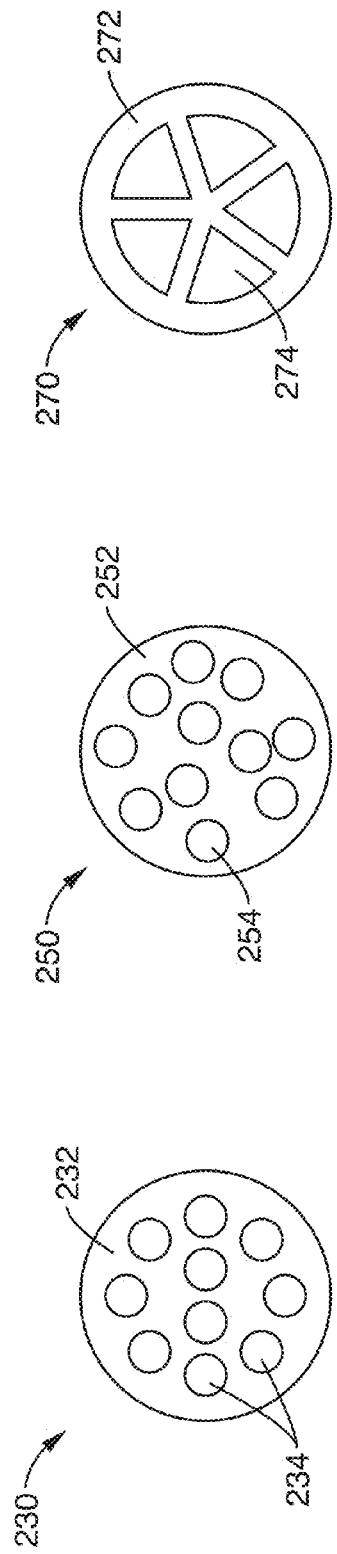

HOLLOW SUPPORTS AND ANCHORS FOR MECHANICAL RESONATORS

CROSS-REFERENCE TO RELATED APPLICATIONS

This application is a 35 U.S.C. §111(a) continuation of PCT international application number PCT/US2012/061221 filed on Oct. 19, 2012, incorporated herein by reference in its entirety, which claims priority to, and the benefit of, U.S. provisional patent application Ser. No. 61/549,420 filed on Oct. 20, 2011, incorporated herein by reference in its entirety. Priority is claimed to each of the foregoing applications.

The above-referenced PCT international application was published as PCT International Publication No. WO 2013/059749 on Apr. 25, 2013, incorporated herein by reference in its entirety.

STATEMENT REGARDING FEDERALLY SPONSORED RESEARCH OR DEVELOPMENT

This invention was made with Government support under W31P4Q-09-1-0006 awarded by the Defense Advanced Research Projects Agency (DARPA). The government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to micromechanical resonators, and more particularly to a micromechanical resonator with a hollow attachment stem.

2. Description of Related Art

Capacitively transduced vibrating polysilicon micromechanical resonators have achieved Q's over 160,000 at 61 MHz and Q's larger than 14,000 at approximately 1.5 GHz, and most recently above 40,000 at 3 GHz. These high Q values make these micromechanical resonators particularly well-suited for on-chip frequency selecting and setting elements for filters and oscillators, such as utilized in wireless communication applications. The aforementioned Q's were achieved by first recognizing that anchor loss dominated at UHF, and using design strategies to suppress such loss, including attaching to the vibrating structure at nodal locations, minimizing support dimensions (e.g., reducing stem size), using different materials for the support and vibrating structure to effect an energy reflecting impedance mismatch, and using quarter wavelength supports. To date, oscillators employing the above high-Q resonators have already been demonstrated with phase noise performance commensurate with GSM cellular phone specifications for reference oscillators.

However, certain applications such as software-defined cognitive radio, demand even higher Q's at RF frequencies to enable low-loss selection of single channels (rather than bands of them) to reduce power consumption of succeeding electronic stages down to levels more appropriate for battery-powered handhelds.

BRIEF SUMMARY OF THE INVENTION

By way of example, and not of limitation, this document discloses the invention of forming and using hollow supports and anchors to reduce the cross-section of material through which energy can escape a vibrating resonator through its supports and anchors, thereby reducing the energy lost and in turn increasing the quality factor Q of the resonator.

In particular, the use of hollow support stems to reduce energy loss to the substrate while supporting all-polysilicon UHF micromechanical disk resonators has enabled quality factors as high as 56,061 at 329 MHz and 93,231 at 178 MHz—values now in the same range as previous disk resonators employing multiple materials with more complex fabrication processes. Measurements confirm Q enhancements of 2.6 times for contour modes at 154 MHz and 2.9 times for wine glass modes around 112 MHz over values previously achieved by full stem all-polysilicon disk resonators with identical dimensions. The measured results not only demonstrate an effective Q-enhancement method with minimal increase in fabrication complexity, but also provide in-sights into anchor loss mechanisms that have been largely responsible for limiting the Q's attainable by all-polysilicon capacitively-transduced MEMS resonators.

The invention is well suited for a number of different uses, including but not limited to the following: (1) Filters for RF channel-selecting filters that can enable practical software-defined cognitive radio. (2) Ultra-low noise oscillators for timing, radar, navigation, and communications, where the higher the Q, the lower the noise of the oscillator, and the wider its application range. (3) Gyroscopes, accelerometers, and inertial measurement units that employ resonating elements, such as MEMS-based gyroscopes used in automobiles, cell phones, and gaming wands (e.g., the Wii). (4) Sensors that employ resonating elements, including the aforementioned inertial measurement units, but also sensors for gas, temperature, pressure, motion, stress, and just about everything that would need to be sensed. It should be appreciated that resonant sensors are widely recognized as perhaps the most sensitive sensors available. (5) High Q tank circuits utilized in communication systems as well as a myriad of other integrated circuits. High Q benefits virtually all integrated circuit applications. (6) Energy scavenging devices, where Q often governs the overall efficiency and capability of the energy scavenger.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 6 and FIG. 7 are schematics comparing the shape of the fabricated demonstration stem shown in FIG. 5B with another form of stem cap shown in FIG. 4C.

FIG. 20A through 22B are side and top views of alternate hollow stems according to embodiments of the present invention.

DETAILED DESCRIPTION OF THE INVENTION

1. Introduction

Apparatus and methods of the present invention further increase the Q of micromechanical devices having resonant properties by incorporating hollow stems. By way of example and not limitation, the primary embodiment described is that of a micromechanical disk resonator. In a micromechanical disk resonator, this "hollow" stem anchors the disk of to the base (underlying layer) which suppresses energy loss to increase device Q.

Measurements confirm Q enhancements of 2.6 times (2.6 times) for contour modes at 154 MHz and 2.9 times for wine glass modes around 112 MHz over values previously achieved by full stem all-polysilicon disk resonators with identical dimensions. Measured Q's as high as 56,061 at 329 MHz and 93,231 at 178 MHz further attest to the efficacy of this approach.

2. Hollow Stem Disk

Figure 1:
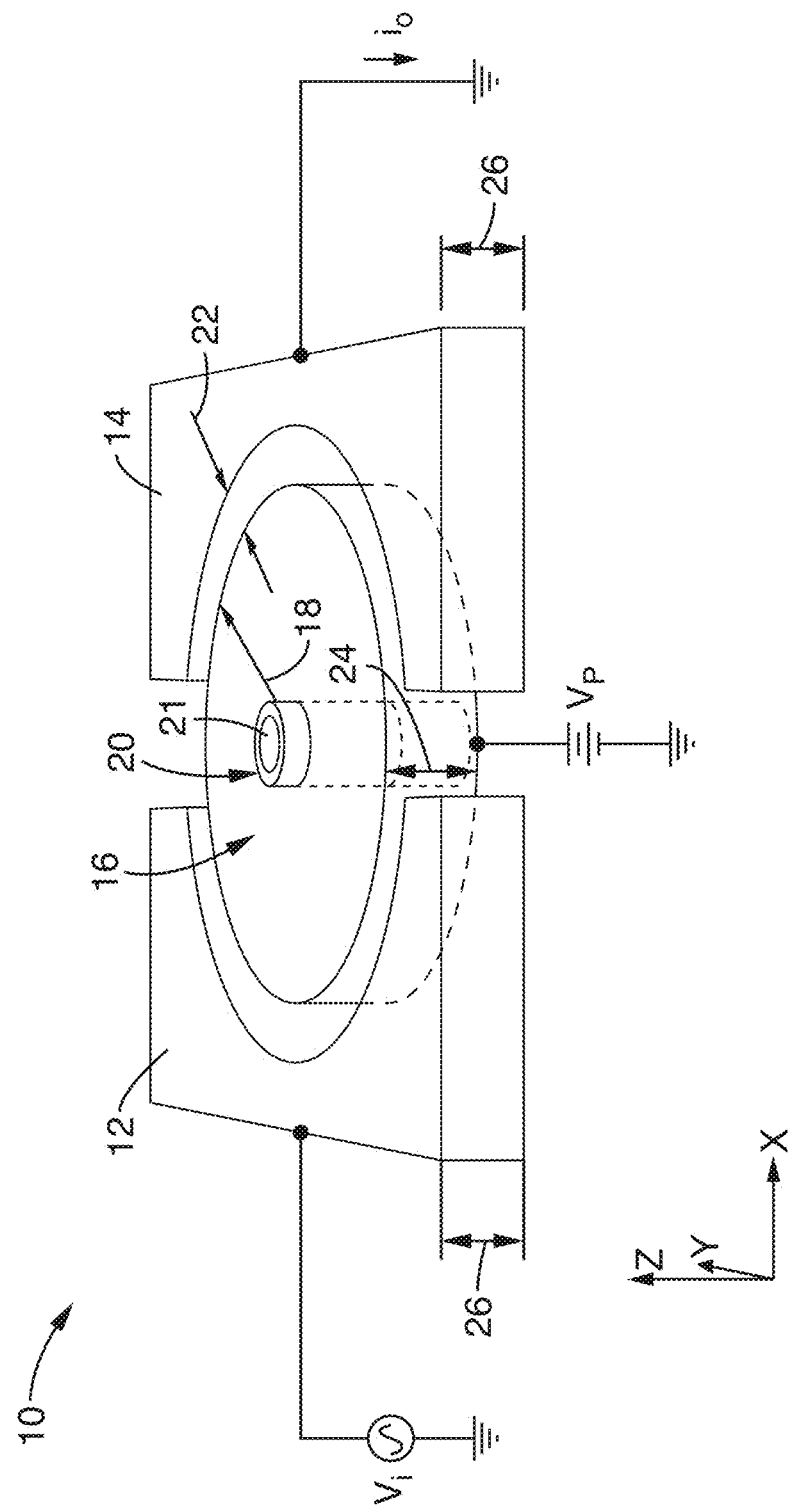
FIG. 1 is a schematic of a micromechanical resonator according to an embodiment of the present invention, shown with the hollow core.

FIG. 1 illustrates an embodiment 10 of a hollow stem disk resonator in a typical bias, excitation, and detection scheme. This device comprises a disk (e.g., 2 μm thick in this example) surrounded by two closely spaced ($d_o$=80 nm) electrodes 12 and 14. It should be appreciated that although two electrodes is typical, a single electrode may be utilized for both receiving the input voltage and generating the output current. The electrodes are deemed "closely spaced" as the gap is preferably only sufficiently large enough to prevent contact between disk and electrodes in the fabricated disk resonator devices. Micromechanical disk 16 has a radius 18, such as approximately 17 μm in this example embodiment, and is supported by an anchored stem 20 attached at the center of the disk. It should be appreciated that the size (length and width) and thickness of the elements described can be readily adapted in response to frequency of operation and application, without departing from the teachings of the present invention. The material of stem 20 surrounds a hollow portion 21. Disk 16 is separated from electrodes 12, 14 by a disk-to-electrode gap ($d_o$)) 22. The thickness of disk 24 and electrodes 26, in this example embodiment, are approximately 2 μm.

By way of example, the disk is described as fabricated of polysilicon, however, it should be appreciated that the disk may be fabricated of other materials, including but not limited to oxide, metals, aluminum nitride (AlN) and so forth.

The stem 20 is "hollow" in that it comprises an outer thickness of material for the stem surrounding a hollow area interior of the stem which does not contain the solid structural material. Preferably the hollow portion of the stem extends through the major portion (e.g., greater than 50%) of the length of the stem. Although the stem is shown having a circular cross-section, it should be appreciated that it may be fabricated in any desired shape or material containing interior hollow areas, such as triangular, square, hexagonal, octagonal, and other geometric shapes and combinations thereof. Preferably a volume of at least 25% of overall stem volume is hollow and thus is void of structural material. In addition, the stem need not be fabricated of the same material as the resonator.

Toward minimizing transducer losses that might otherwise mask the influence of anchor loss on Q, this embodiment of the inventive device employs a capacitive transducer. The device is excited into resonance in response to a combination of a direct current (DC) bias voltage $V_P$, as seen in FIG. 1, applied to the conductive polysilicon resonant structure, and an alternating current (AC) signal $v_i$ applied to the input electrode, which together induce a force at the frequency of $v_i$ driving the disk into resonance vibration when the frequency of $v_i$ matches the resonance frequency. Once vibrating, the $V_P$ biased time varying capacitance between the disk and its output electrode generate an output current $i_o$, which is detectable by measurement instrumentation or other circuitry.

It should be appreciated that resonators utilizing the inventive hollow stems may be transduced in any desired manner, with any desired means of transduction, without departing from the tenets of the invention; including without limitation capacitively, piezoelectrically or optomechanically transducing means. It is not surprising that the materials utilized in this range of resonator types can also vary significantly (e.g., polySi, piezo materials, glass, and any other materials which can be sufficiently excited). Conventional mechanisms for reducing stem diameter result in weakening the structure and increase fabrication difficulties. More particularly, these practical barriers to continued scaling of stem diameters comprise the following. First, as a stem is thinned, its support strength is lessened, so there is a minimum stem diameter and length that can support a disk of a given size for a given set of conditions. Second, even if a stem maintains sufficient strength while scaled to nanometer dimensions, the need to both form it and place it exactly at the disk center, poses fabrication challenges.

In the present invention, it has been found that fabricating the device with a hollow stem, provides similar benefits as reducing stem diameter, while still being able to maintain sufficient strength and ease of fabrication. The hollow stem provides reduced cross-sectional area that reduces the conduit through which energy can pass from the vibrating disk structure to the substrate.

The hollow stem seen in FIG. 1 circumvents the above issues by employing a hollow cylinder with thin walls, rather than a single thin stem. Since the walls are thin, the cross-sectional area of the stem is still very small. However, the structure still retains a significant portion of the strength of a full stem with the same diameter.

Figure 2B:
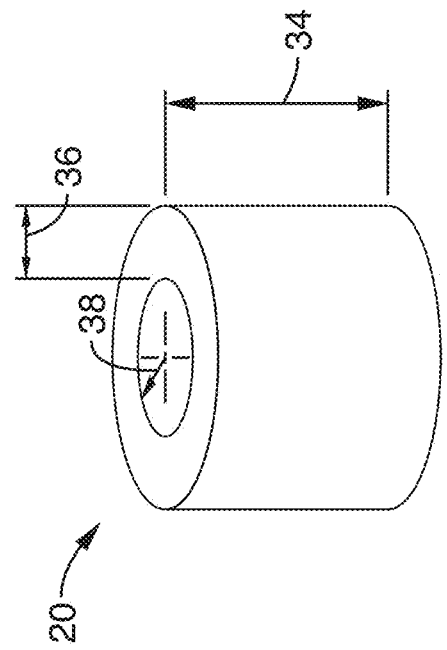
FIG. 2A and FIG. 2B are pictorial views comparing a solid resonator stem in FIG. 2A with a hollow resonator stem in FIG. 2B according to an embodiment of the present invention.
Figure 2A:
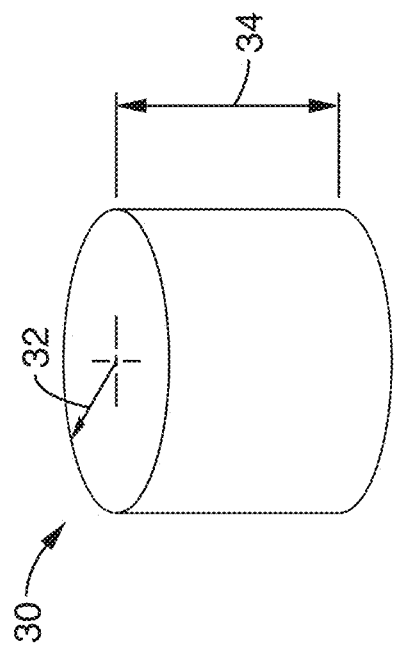

FIG. 2A and FIG. 2B illustrate a comparison between a solid (full) stem 30, compared with a hollow stem 20 according to the present invention. In FIG. 2A a full stem is shown with a radius 32, such as $a_0=1$ µm and a height 34. In FIG. 2B a hollow stem 20 is shown with height 34, wall thickness (width) 36 of the ring, such as 0.5 µm, and an interior radius 38 $a_i=0.5$ µm. The moment of inertia for the hollow stem is found to be approximately 94% of that of the solid stem of the same exterior dimension, while the cross-sectional area of the hollow stem is only 44% of the solid stem.

Figure 3C:
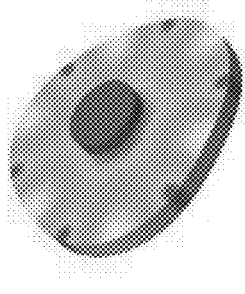
FIG. 3A through FIG. 3D are images of resonant mode shapes of the micromechanical resonator of FIG. 1, showing contour, wine glass, third order whispering gallery, and sixth order whispering gallery modes.
Figure 3B:
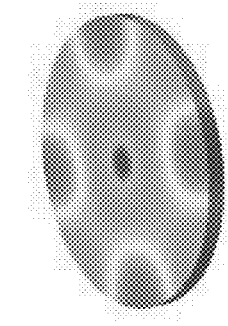
Figure 3D:
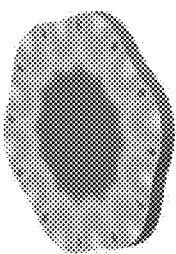
Figure 3A:
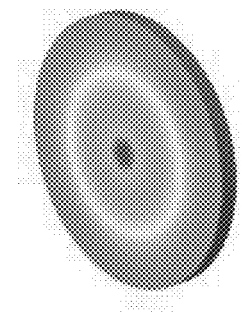

FIG. 3A through FIG. 3D illustrate operating modes of the disk resonator of FIG. 1, including contour mode in FIG. 3A, wine-glass mode in FIG. 3B, third order whispering gallery (WG) mode in FIG. 3C, and sixth order WG mode in FIG. 3C. It will be appreciated that the stem attachment location is centered on the center nodal point of the disk. If the stem had zero radius it would be considered a perfect anchor, since it would receive no strain energy from the disk during motion. The shading in the figures represents the extent of mechanical excitement on the disk structure.

3. Fabrication Process

The fabrication process for the inventive hollow stem device preferably utilizes a self-aligned stem process that centers the stem precisely at the disk center nodal point to eliminate disk-to-stem misalignment, and allow for different stem and disk film thicknesses.

Figure 4A:
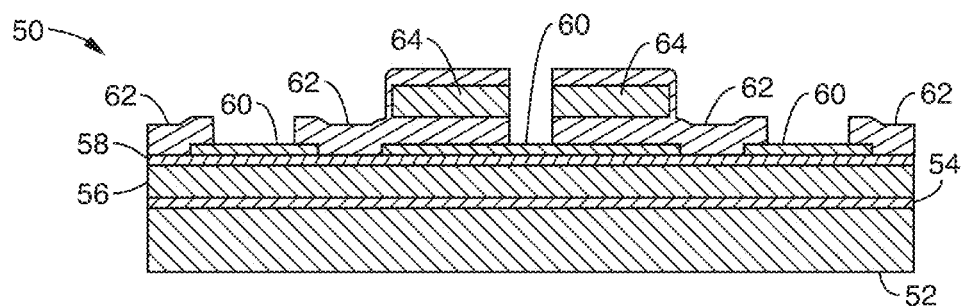
FIG. 4A through FIG. 4C are cross-section views of micromechanical resonator fabrication steps according to an embodiment of the present invention.
Figure 4B:
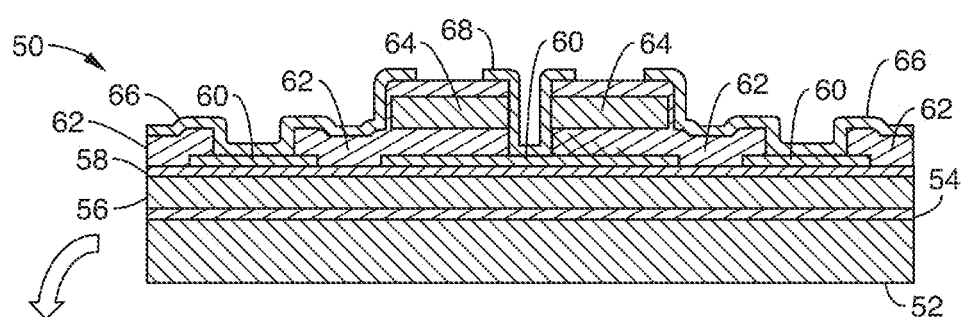
Figure 4C:
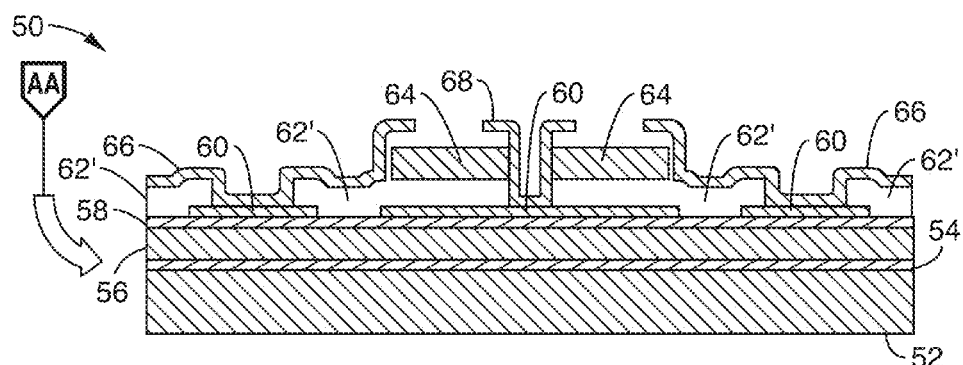

FIG. 4A through FIG. 4C illustrate an example embodiment 50 of fabricating a hollow stem disk resonator according to the invention. The process begins with layer depositions and patterning (where appropriate) for the substrate 52, along with ground plane and contacts (not shown). On the substrate 52 (e.g., Silicon (Si)) are seen a layer of doped material 54 (e.g., n+ doped Si in this example), an oxide layer 54 (e.g., $SiO_2$), and a nitride layer 56. Polysilicon is shown for the interconnects 60, covered by a bottom sacrificial layer of oxide 62. The disk layer 64 comprises polysilicon over the bottom sacrificial layer, and having additional top sacrificial material over the disk portion, which is preferably an oxide etch hard mask layer covering the structural material. The hard mask layer allows etching of the structural polysilicon with straighter sidewalls.

Instead of using an anchor mask to first define the stem then another mask aligned to the first to define the disk structure, the process defines both the stem hole position and the disk edges all in one mask, effectively eliminating the possibility of stem misalignment. This maximizes the Q of the ensuing device, since it allows centering of the stem precisely at the disk nodal location. After the single-mask lithography defining the disk and stem hole, the doped polysilicon structural layer is patterned through the oxide hard mask, then a sacrificial sidewall spacer oxide (to define the gap) is preferably deposited via low-pressure chemical vapor deposition (LPCVD) or an atomic layer deposition (ALD) process to yield the cross-section of FIG. 4A. One of ordinary skill in the art will recognize that other processes may be utilized for accomplishing the above step, and the other steps described in the overall fabrication sequence without limitation.

A lithography step then patterns a photoresist masking layer to expose the stem holes while covering everything else. The bottom sacrificial oxide layer under the stem hole is then etched, such as utilizing a combination of dry and wet methods, successively to cut a hole down to the substrate ground plane polysilicon, and also to remove oxide along the sidewalls of the stem hole.

At this point a very thin layer of polysilicon 66, 68 insufficient to refill the stem holes is deposited, such as less than 500 nm, in a fill process, such as via LPCVD at 585° C. followed by $POCl_3$ doping. The conformity of LPCVD polysilicon allows the film to follow the contours of the stem hole, even at corners to arrive at the structure seen in FIG. 4B.

The structure is then subject to an etching process to remove the sacrificial layers to arrive at the structure of FIG. 4C in which the micromechanical disk is freed from the underlying base and electrodes leaving air gaps therebetween. By way of example and not limitation, the etching process may include immersing the device in 49 by weight percentage of hydrofluoric acid for approximately 30 minutes to etch away sacrificial oxide and release the structures.

The U-shaped stem 68 can be seen surrounded by disk material 64 in the figure. It should be noted that although this stem is shown preferably closed at the bottom attachment (e.g., to simplify fabrication), it may alternatively be open at the bottom, closed at the top, contain hollow chambers, and combinations of the above without limitation while adhering to the teachings of the present invention. In addition, the stem may be hollow in response to having a plurality of small vias, fabricated pores, or substructures containing hollow spaces (e.g., honeycomb or other open patterns) distributed through a sufficient portion of this anchor stem to increase the Q of the associated resonator.

Figure 5B:
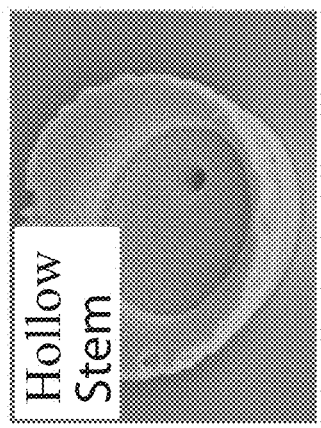
FIG. 5A through FIG. 5C are images (from a scanning electron microscope (SEM)) of a fabricated polysilicon hollow stem disk resonator, fabricated according to an embodiment of the present invention, showing the overall structure in FIG. 5A, the hollow stem in FIG. 5B and the stem via (hole) in FIG. 5C.
Figure 5C:
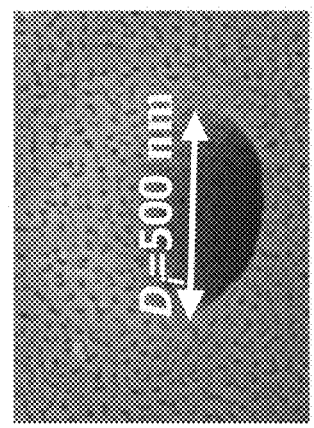
Figure 5A:
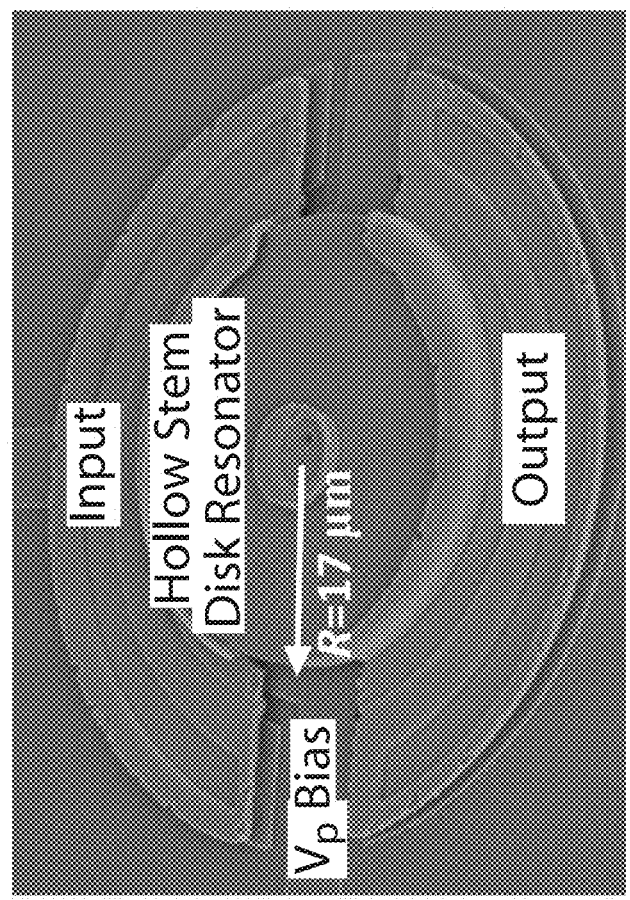

FIG. 5A through FIG. 5C present SEM images of a demonstration hollow stem disk resonator device. The overall device is seen in FIG. 5A with the hollow stem shown annotated at its center. It should be noted that although the small via is not in the perfect form of hollow stem, it does increase Q appreciably. FIG. 5B depicts a zoom-in on this demonstration stem, seen with a mushroom-like top attached to the disk. However, the top portion of the stem is preferably not in contact with the top of the disk.

FIG. 6 and FIG. 7 illustrate a comparison of disk resonator embodiments 70, with base 72, disk 74 and hollow demonstration stem 76 (as was seen in FIG. 5B) extending from base 72 through disk 74 with its top on the surface of disk 74. An alternative stem top (as was seen in FIG. 4C) is shown in FIG. 7 showing outward curving arms separated from the top of the disk surface.

In addition to the thin-walled stem, the SEM of FIG. 5A shows electrodes with equally thin walls. Like the stems, the electrodes benefit from the increased strength of a curved geometry. It will be seen that the electrodes extend around the disk and over the outer periphery of it.

4. Experimental Results

To gauge the Q-enhancing efficacy of hollow stems, measurements on fabricated devices focus on comparison of conventional disk resonators with 2 µm diameter full stems with hollow stem resonators employing the same outer stem diameter, but different stem wall thicknesses of 200 nm and 500 nm.

The devices were tested using mixing measurement methods that allow more accurate measurement of mechanical Q under a 2 µTorr vacuum environment generated by a Lakeshore FWPX cryogenic probe station. Although high frequency micromechanical resonators are less susceptible to gas damping, so can reach Q's on the order of 10,000 in air, vacuum is still required to measure Q's above this level.

To gauge the degree to which hollow stem designs really suppress energy loss to the substrate, the measurements also compare their efficacies for disks vibrating in each of the mode shapes depicted in FIG. 3A through FIG. 3D. In particular, the FEM simulations shown actually depict displacements, where the different shades depict different displacements. A focus on the anchors reveals that whispering gallery modes, including the wine-glass mode, should allow much higher Q's than radial-contour modes if anchor losses dominate.

4A. Radial-Contour Mode

Figure 8:
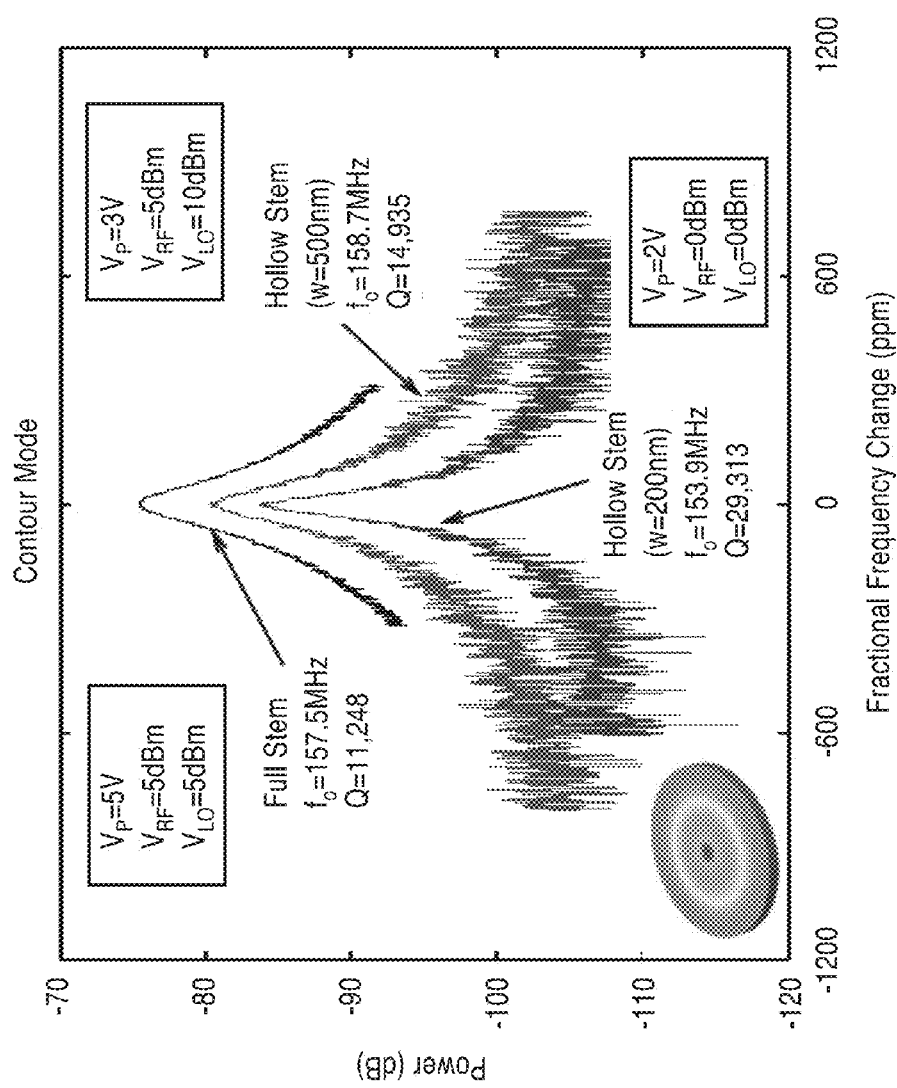
FIG. 8 is a graph comparing frequency characteristics of all-polysilicon disk resonators vibrating in the radial-contour mode for a full stem compared with a hollow stem according to an embodiment of the present invention.

FIG. 8 depicts a combination of measured frequency characteristics of a full stem radial-contour mode disk resonator together with hollow stems having walls of 500 nm and 200 nm walls respectively, all with identical 17 µm radii. The figure plots measured output power along the y-axis against fractional frequency change relative to the resonance frequency of each device along the x-axis. In this graph it is seen that the 200 nm wall hollow stem device achieves a Q of 29,313 at 153.9 MHz, which is more than 2.6 times higher than its identically-dimensioned full stem counterpart. The 500 nm wall hollow stem device also provides an improvement, although smaller, at about 1.3 times better than the full stem case. The smaller the hollow stem wall thickness, the larger the improvement in Q, all confirming the discussion of Section 2.

4B. Wine-Glass Mode

Figure 9:
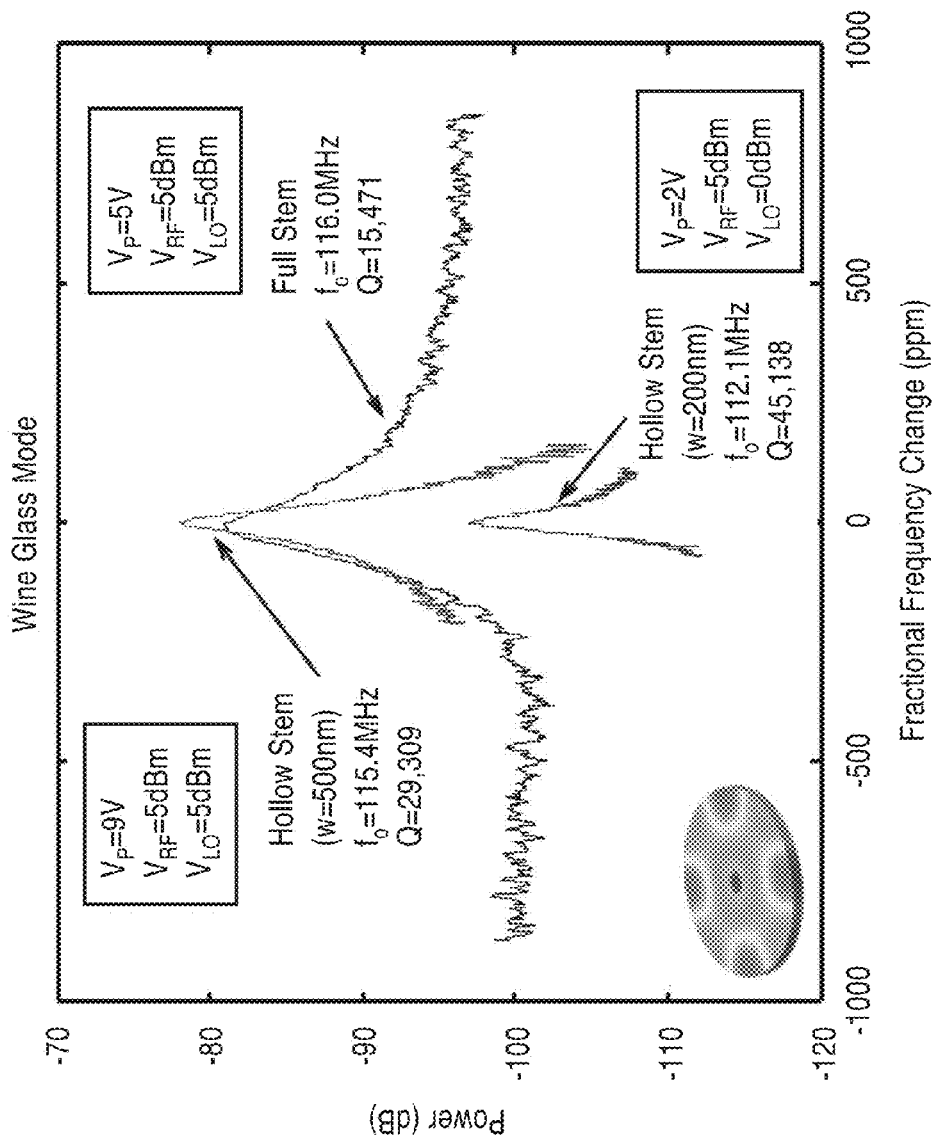
FIG. 9 is a graph comparing frequency characteristics of all-polysilicon disk resonators vibrating in the wine-glass mode for a full stem compared with a hollow stem according to an embodiment of the present invention.

FIG. 9 depicts a combination of measured frequency characteristics of a full stem wine-glass mode disk resonator together with hollow stems having walls of 500 nm and 200 nm walls respectively, all with identical 17 µm radii. Although the input and output electrodes of the device under test are designed for radial-contour mode vibration, they are also able to excite and detect the wine glass mode depicted in FIG. 3B, since both modes have large vibration amplitudes centered over the output electrodes. FIG. 9 presents a plot similar to that of FIG. 8, but this time comparing wine glass modes compared between a solid stem and the two hollow stem embodiments. In the wine glass mode, the highest Q was found to be 45,138 at 112 MHz, again for the 200 nm wall hollow stem disk. As with the radial mode, the Q's of the wine-glass mode also improve with decreasing hollow stem thickness, with a 2.9 times improvement for the 200 nm wall hollow stem versus full stem.

4C. Whispering Gallery Modes

Figure 10:
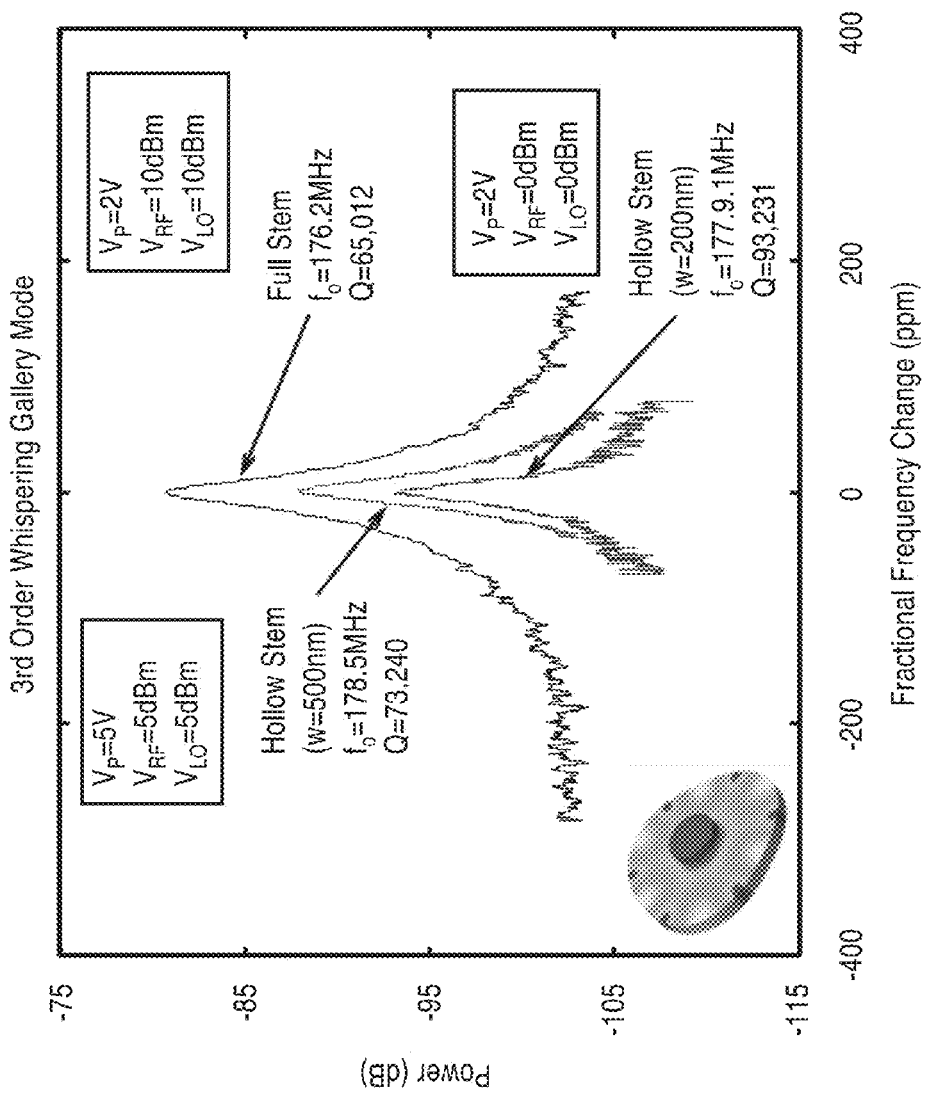
FIG. 10 is a graph comparing frequency characteristics of all-polysilicon disk resonators vibrating in the third order whispering-gallery mode for a full stem compared with a hollow stem according to an embodiment of the present invention.

FIG. 10 depicts a combination of measured frequency characteristics of a full stem $3^{rd}$ order whispering gallery mode disk resonator together with hollow stems having walls of 500 nm and 200 nm walls respectively, all with identical 17 µm radii. It will be noted that the wine-glass mode of the previous section is actually just one of many whispering gallery modes of the disk structure. In the wine-glass mode, there are two positive vibration amplitude maxima, making it a second order whispering gallery mode (WGM). The mode in FIG. 10 is a third order WGM with three maxima. Whispering gallery modes differ from the radial-contour mode in that their acoustic wave propagates around the disk periphery, rather than in the radial direction. Thus, while the radial-contour mode undergoes tremendous volume expansion and contraction during vibration, a whispering gallery mode conserves its volume, resulting in less displacement near the center of the disk, hence less Poisson expansion along the z-axis at the stem location. This then leads to smaller energy loss to the substrate and higher Q, which is consistent with the measurement results showing that wine glass mode Q for the 200 nm wall hollow stem disk in FIG. 9 is larger than the highest posted by the radial-contour mode devices of FIG. 8.

Higher order WGM's, such as the third order one of FIG. 10, further exhibit a dramatically larger displacement-free area around their stems than lower order ones, as shown in the displacement FEM simulations of FIG. 3B and FIG. 3C. This indicates that the former should lose less energy through the stem to the substrate no matter the type of stem, suggesting that higher order whispering gallery modes should post even higher Q's that are less dependent upon stem design.

The third order WGM plot of FIG. 10 compares third order WGM's for the different devices. The highest measured Q is now 93,231 at 177.9 MHz, again for the 200 nm wall hollow stem disk. As predicted, this is much higher than exhibited by the other modes depicted in FIG. 8 and FIG. 9. Although impressive, the Q of this device is only 1.4 times higher than that of the same mode of the full stem device, which posts a Q of 65,012 at 176.2 MHz that is still quite large. Thus, hollow stem design is still beneficial for whispering gallery modes, but its benefits over a full stem diminish as mode order increases.

Figure 11:
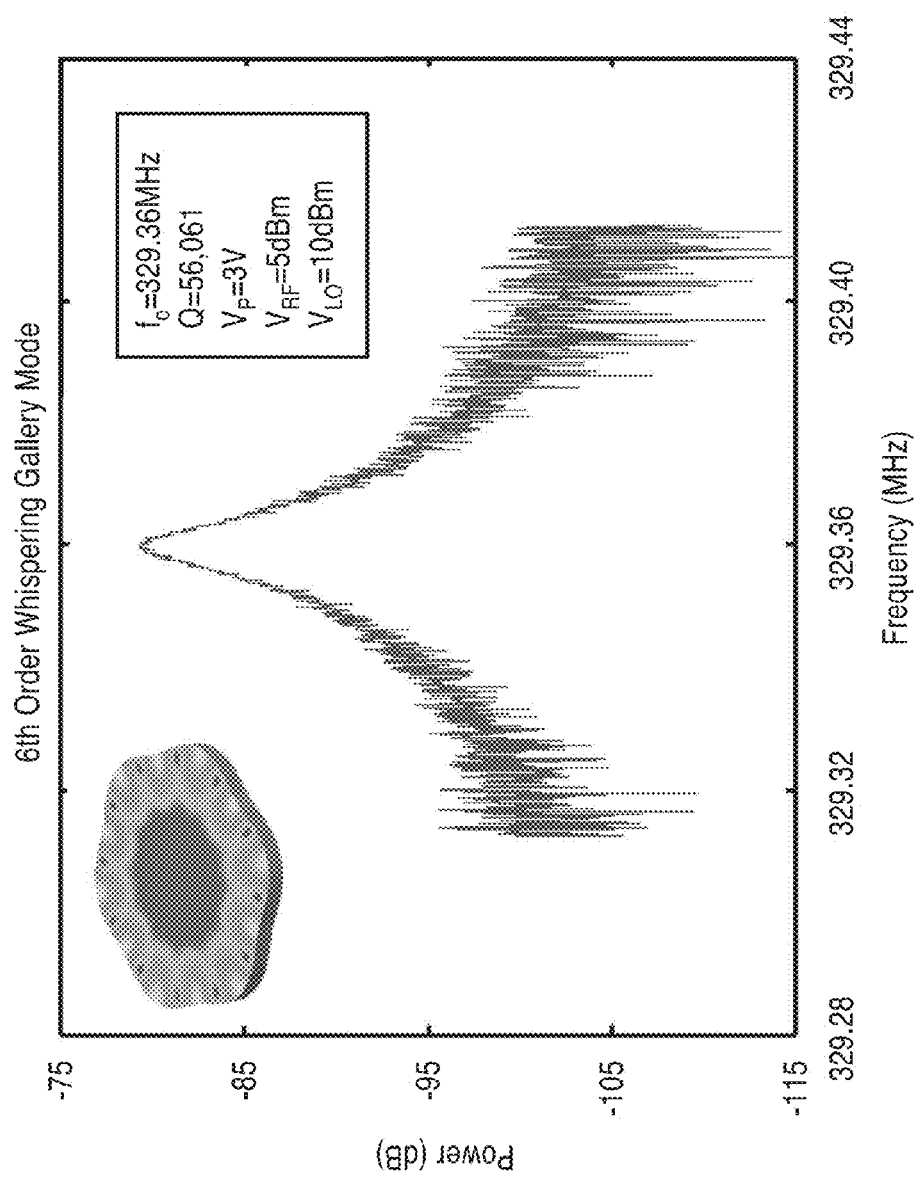
FIG. 11 is a graph comparing frequency characteristics of all-polysilicon disk resonators vibrating in the sixth order whispering-gallery mode for a full stem compared with a hollow stem according to an embodiment of the present invention.

FIG. 11, by way of comparison plots the frequency characteristics of a 17 μm radius disk employing a 500 nm thick hollow stem to achieve a Q of 56,061 at 329 MHz while vibrating in its 6th order whispering gallery mode.

Figure 12A:
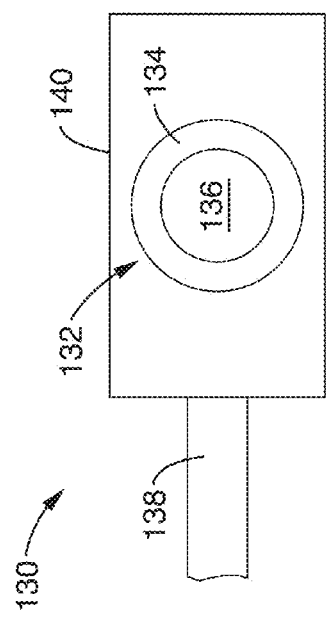
FIGS. 12A and 12B are side and top views of a portion of a micromechanical resonator showing a beam supported by a hollow anchor according to an embodiment of the present invention.
Figure 12B:
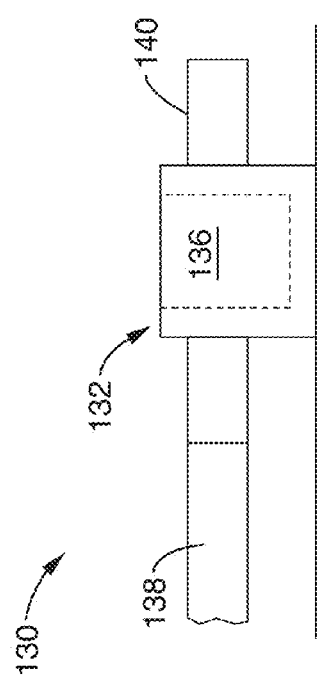

FIG. 12A and FIG. 12B are side and top views, respectively, illustrating an embodiment 130 of a generalized hollow stem and beam element. A hollow stem 132 is seen with exterior structural material 134 surrounding a hollow region 136 which is void of structural material (e.g., has air space). It should be appreciated that the hollow region may be of different shapes or segmented to otherwise reduce the amount of interior structural material, without departing from the invention. A beam 138 is shown with attachment element 140 coupled to hollow stem 132. The above illustration is in contrast to conventional beams which do not provide the benefits of the invention.

Figure 13:
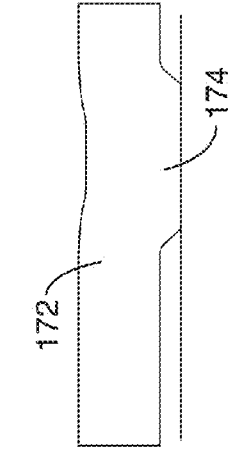
FIG. 13 is a side view of a typical micro-electromechanical system (MEMS) beam attachment.
Figure 14:
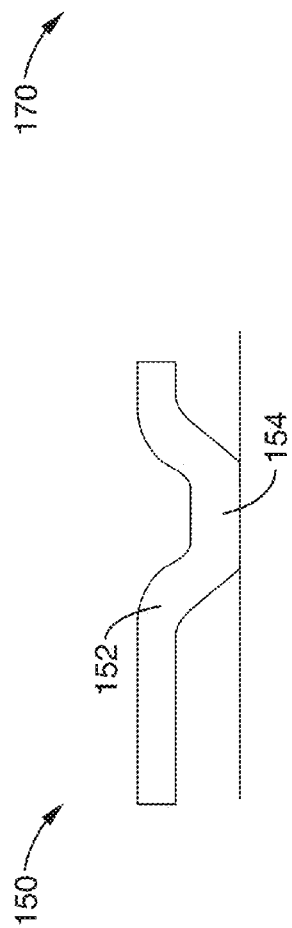
FIG. 14 is a side view of another micro-electromechanical system (MEMS) beam attachment.

FIG. 13 and FIG. 14 illustrate conventional beam anchor geometries. An anchor of a typical microelectro-mechanical system (MEMS) 150 is shown in FIG. 13 with beam 152 extending from anchor 154. It will be seen that the angles are not right angles, which allows out of plane beam motion. In addition the anchor is generally of the same thickness as the structural material of the beam. FIG. 14 illustrates another form of beam anchor geometry 170, with beam 172 and anchor 174. Due to its fabrication, the beam 172 has only a small gap above the underlying layer, while the anchor is approximately the thickness of the beam and has a recess from the fabrication process. It can be clearly seen that the very little dip of this recess is not the same as the hollow stem of the present invention, as the recess of FIG. 14 is formed only as a byproduct of fabrication and is of insufficient depth to provide any resonance advantage.

Figure 16:
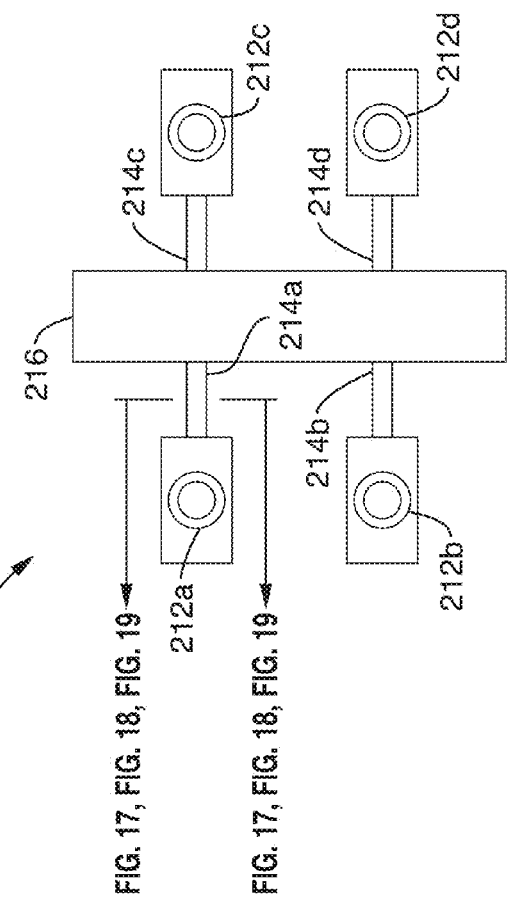
FIG. 16 is a top view of a free-free beam resonator utilizing the hollow anchor according to an embodiment of the present invention.
Figure 15:
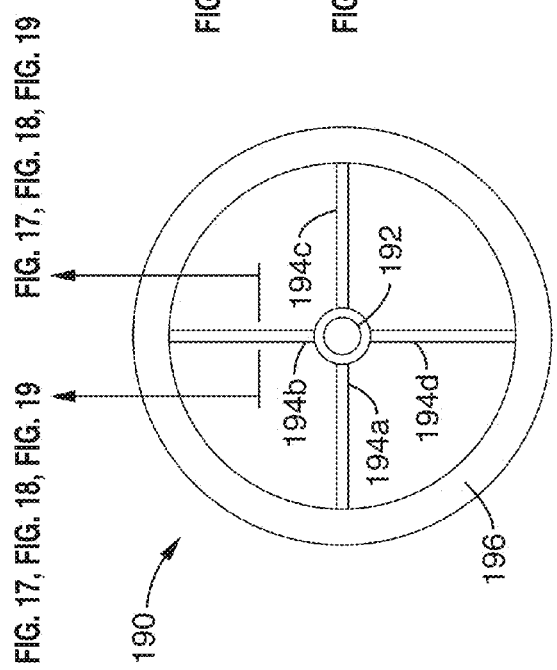
FIG. 15 is a top view of a ring resonator utilizing the hollow anchor according to an embodiment of the present invention.

FIG. 15 and FIG. 16 illustrate, by way of example and not limitation, additional micromechanical resonator embodiments which can benefit from the hollow stems of the present invention. In FIG. 15 a micromechanical ring resonator 190 is shown with hollow stem 192, from which spoke supports 194a-194d extend to an outer ring 196. In FIG. 16 a micromechanical free-free resonator 210 is shown with hollow stems 212a-212d from which support beams 214a-214d extend to a free beam 216. It should be noted that the hollow stem of FIG. 12A-12B can be utilized in any number and form of free-free, clamped-clamped, or clamped-unclamped resonant structure according to the invention. By way of example FIG. 16 shows four hollow stems in a single resonant structure to illustrate that any desired number of hollow stems may be utilized depending on the application toward increasing Q. Still further, in certain applications it may be desirable to mix hollow stems and non hollow stems, or to use stems hollowed to different extents, or combinations thereof.

Figure 17:
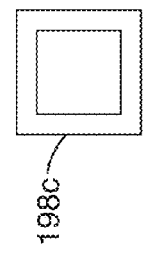
FIG. 17 through FIG. 19 are cross sections of hollow support elements according to an embodiment of the present invention.
Figure 18:
Figure 19:
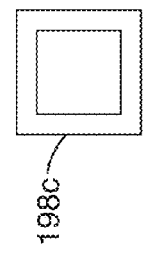

FIG. 17 through FIG. 19 illustrate cross sections examples of hollow supports. The supports 194a-194d in FIG. 15, and 214a-214d in FIG. 16 can be made hollow in like manner as the stems 192 and 212a-212d. The use of hollow supports reduces the conduit for energy loss and similarly increases Q of the resonator. To simplify fabrication, these hollow supports are shown by way of example and not limitation in FIG. 17 formed as an open concave member, such as a U-shaped hollow channel 198a, in FIG. 18 as an inverted U-shape 198b, or in FIG. 19 as a closed shape as a rectangular member with hollow core 198c. The supports may be alternatively hollowed in other ways, for instance the supports may be hollowed as described below in FIG. 20A through FIG. 22B for the hollow stems.

FIG. 20A through FIG. 22B illustrate additional example embodiments of hollow stems that may be utilized for increasing the Q of micro-scale resonant devices. In FIG. 20A and FIG. 20B side and top views are seen of a stem 230 with structural material 232 and a plurality of vias 234 which "hollow" the interior of the stem toward increasing resonant Q value. In FIG. 21A and FIG. 21B side and top views depict a stem 250 with structural material 252 and a large porous structure of fabricated voids 254 (e.g., air space) which "hollow" the stem toward increasing resonant Q value. In FIG. 22A and FIG. 22B side and top views are seen of a stem 270 with structural material 272 in a pattern surrounding a plurality of voids (e.g., air spaces) 274 which "hollow" the interior of the stem toward increasing resonant Q value. By way of example and not limitation, in FIG. 22B a five-spoke honeycomb pattern can be seen, while other patterns are equally applicable that reduce the material through the center of the stem. It should be appreciated that these embodiments are not equivalent, each having its own benefits and shortcomings.

FIG. 23A through FIG. 23D illustrate an example embodiment 290 of fabricating a disk resonator with a strong electrode. This process begins in FIG. 23A similarly to that of FIG. 4A through FIG. 4C, with deposition of oxide 294 and $Si_3N_4$ or $Al_2O_3$ 296 isolation layers over a starting silicon (Si) substrate 292, deposition and patterning of interconnect polysilicon (polySi) 298, deposition of a bottom sacrificial oxide layer 300, and deposition and patterning of structural polysilicon 304 and a top oxide hard mask 306 layer to form the disk with center hole, as well as electrode support "spines" 302. Next, sidewall sacrificial spacer oxide 310 is deposited conformally over all surfaces. Photoresist 312 is then deposited and patterned to cover most of the disk and the area of the electrode spines close to the disk. In all other areas, oxide is etched first using an anisotropic dry process to reach the underlying interconnect polysilicon 298, then a wet etch (e.g., using hydrofluoric acid) to remove sidewall oxide between spines and in the stem.

Figure 23A:
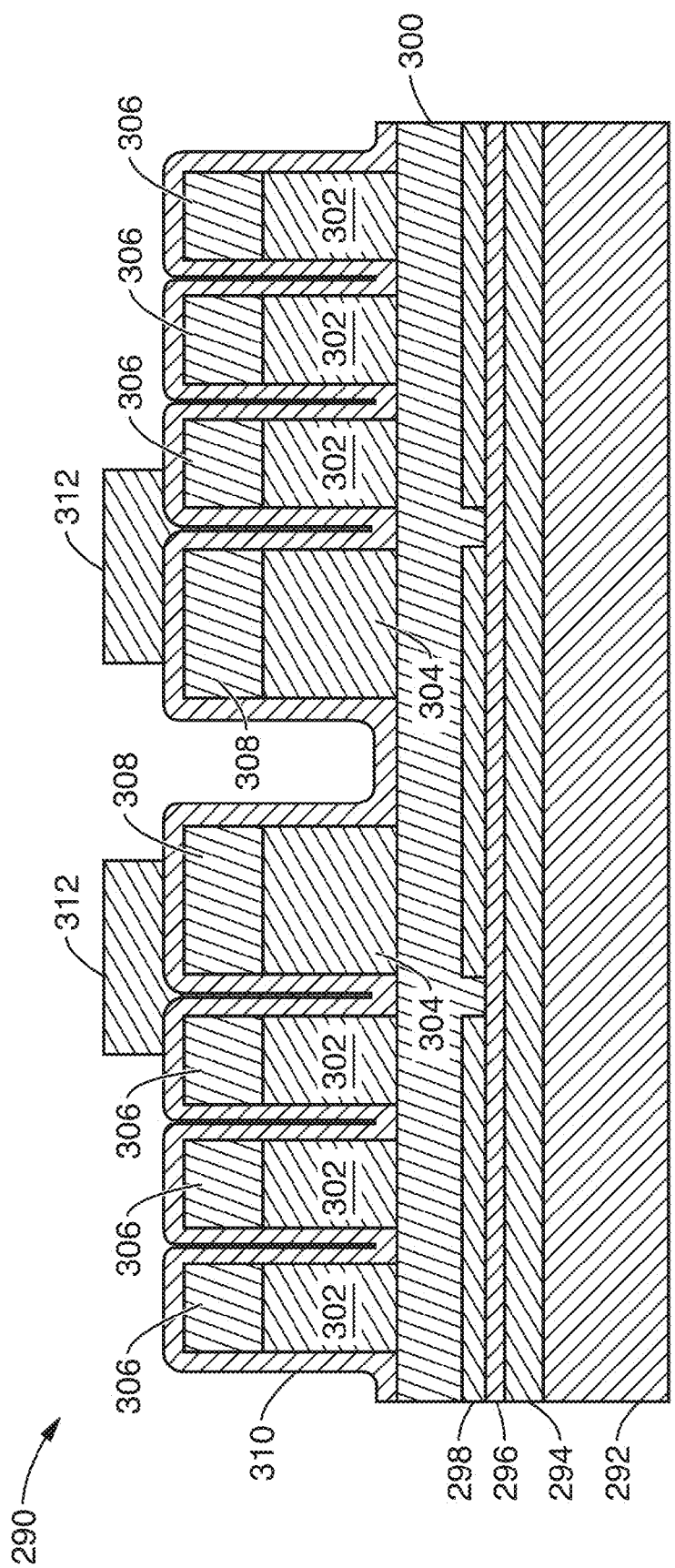
FIG. 23A through 23D are cross-section views of micromechanical resonator fabrication steps according to an embodiment of the present invention shown with reinforced electrodes.
Figure 23B:
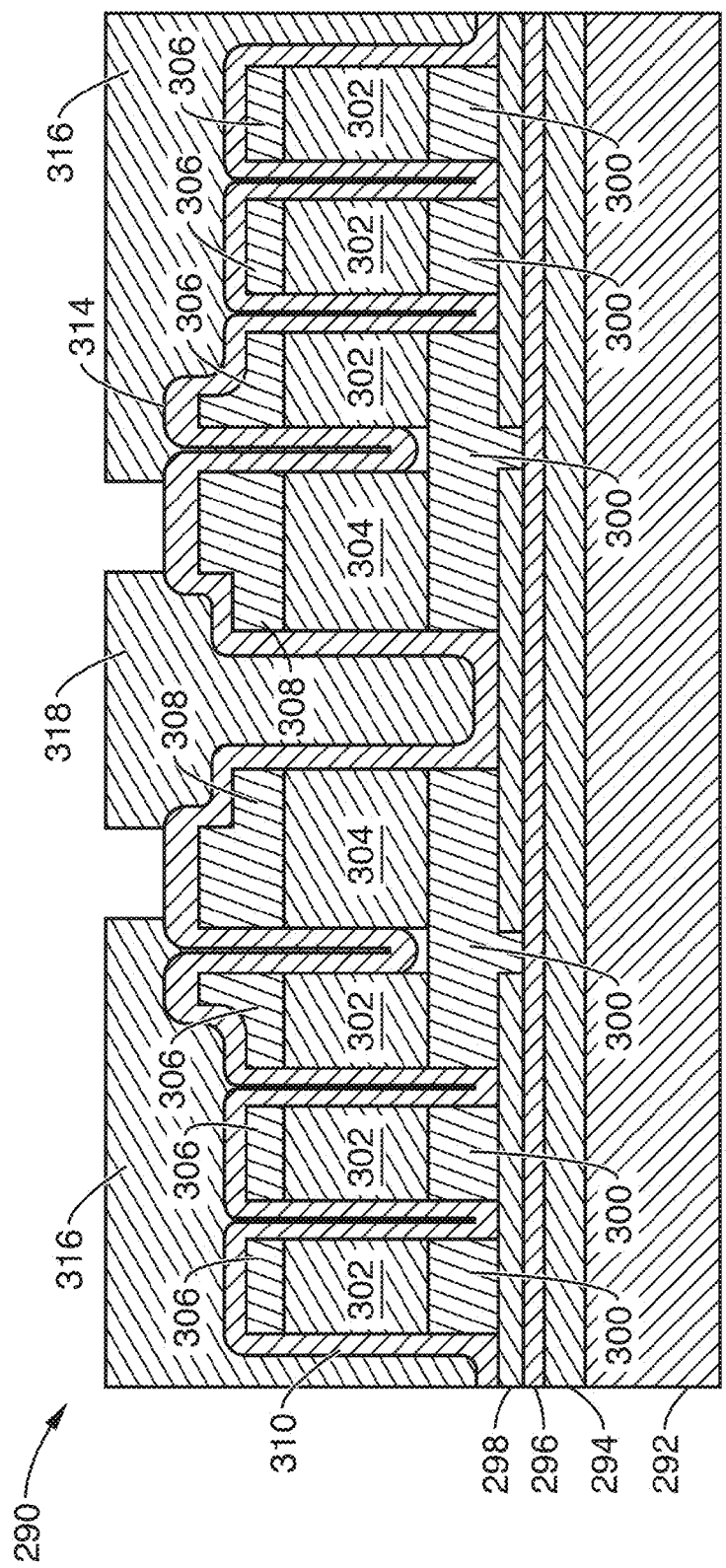

In FIG. 23B, polysilicon 314 is then deposited to a thickness desired for the hollow stem cylinder wall, and masked with mask 316, 318.

Figure 23C:
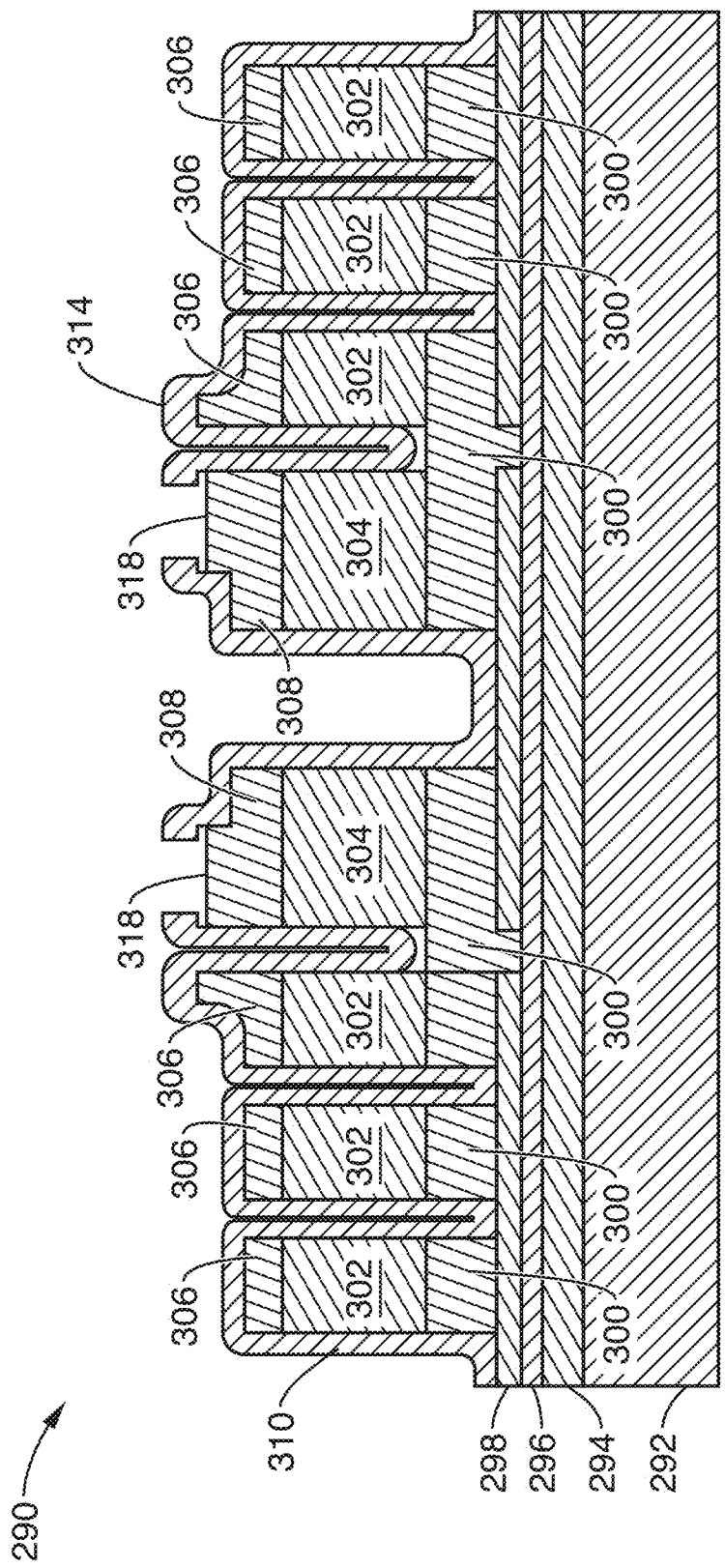
Figure 23D:
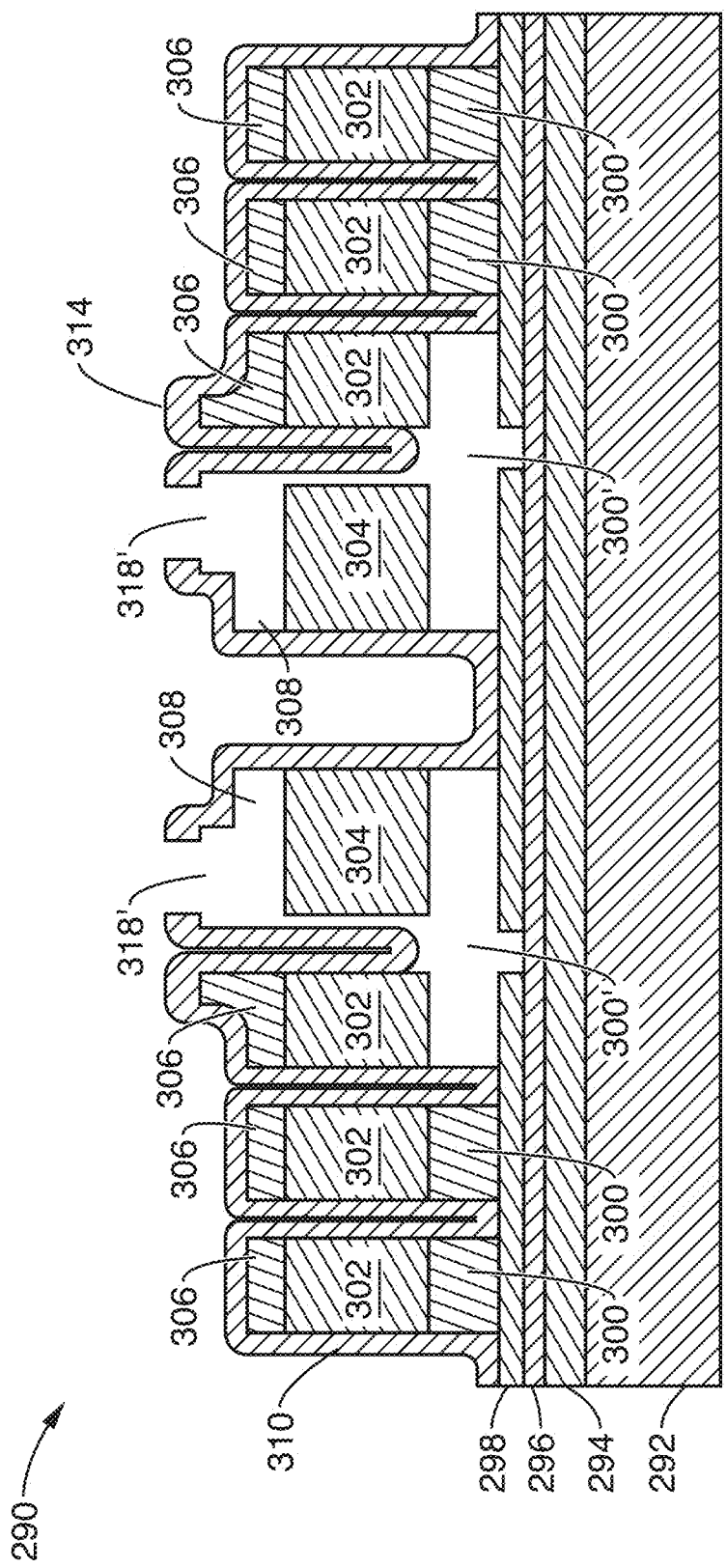

In FIG. 23C the structure is lithographically patterned using the mask to delineate the stem mushroom and the electrode overhang, showing spaces 318 between the stem and electrode areas. Alternatively, a chemical mechanical polishing (CMP) step can be utilized to remove polysilicon and a stop on the oxide can be employed. In FIG. 23D a final timed release etch is performed, such as in liquid for vapor phase HF to free the disks from the electrodes. It will be seen that some of the sacrificial materials 300, 308, about the disk have been removed, wherein air spaces 300', and 308' remain. The resulting electrode of this resonant disk device benefits from being significantly stronger than typical electrodes and even the curving electrodes shown in FIG. 4A through FIG. 4C.

5. Conclusions

Anchor losses dominate the Q's of high frequency micromechanical resonators. Constructing micromechanical resonators with hollow stems according to the invention reduces the resonator-to-substrate energy conduit towards higher resonator Q. The measured Q enhancements in this work of 2.6 times for hollow stem radial-contour mode disk resonators at 154 MHz and 2.9 times for wine glass mode ones at 112 MHz versus identically dimensioned full stem counterparts confirms how the use of hollow stems according to the invention maximizes resonator Q. This approach not only circumvents lithography challenges otherwise needed by other stem-size reducing Q-enhancement approaches, but does so with zero increase in fabrication complexity over conventional methods for achieving stemmed resonators, making it a very simple and effective way to enhance quality factor. In the lower UHF range (around 329 MHz), a Q of 56,061 is achieved by a hollow stem disk resonator vibrating in its sixth order whispering gallery mode, which is high enough to build RF front-end channel-select filters and low phase noise local oscillators for the low end of next generation wireless architectures, such as software-defined cognitive radios. Similar Q's are needed at even higher frequencies, where the hollow stem approach should be even more effective.

From the discussion above it will be appreciated that the invention can be embodied in various ways, including the following:

1. A mechanical resonator apparatus, comprising: a base layer; a mechanical structure with a resonance frequency; and a stem which anchors and supports said mechanical structure on said base; said stem being hollow to suppress resonant energy losses.

2. The apparatus of any of the previous embodiments, wherein said mechanical resonator is a micromechanical resonator.

3. The apparatus of any of the previous embodiments, wherein said mechanical resonator is a micromechanical disk resonator.

4. The apparatus of any of the previous embodiments, wherein said mechanical resonator is a micromechanical ring resonator 5. The apparatus of any of the previous embodiments, wherein said mechanical resonator is a micromechanical resonator is a clamped beam resonator.

6. The apparatus of any of the previous embodiments, wherein said mechanical resonator is capacitively transduced.

7. The apparatus of any of the previous embodiments, wherein said mechanical resonator is piezoelectrically transduced.

8. The apparatus of any of the previous embodiments, wherein said mechanical resonator is optomechanically transduced.

9. The apparatus of any of the previous embodiments, wherein said stem is hollow in response to having an outer thickness of material surrounding a hollow, which is void of solid material.

10. The apparatus of any of the previous embodiments, wherein said stem is hollow in response to having a plurality of distributed vias and/or substructures containing hollow spaces in the stem material.

11. The apparatus of any of the previous embodiments, further comprising supports connecting to one or more said stems, wherein said supports are open concave members or hollow closed structures.

12. The apparatus of any of the previous embodiments, further comprising supports connecting to one or more said stems, wherein said supports are hollow in response to having a plurality of distributed vias and/or substructures containing hollow spaces in the material of said support.

13. A micro-scale disk resonator apparatus, comprising: a base layer; a micromechanical disk of a resonant material; a stem mechanically anchoring the center of said micromechanical disk to said base layer; said stem being hollow to suppress resonant energy losses; and means of transducing said micromechanical disk of a resonant material.

14. The apparatus of any of the previous embodiments, wherein said stem is hollow in response to having an outer thickness of material surrounding a hollow, which is void of solid material.

15. The apparatus of any of the previous embodiments, wherein said stem is hollow in response to having a plurality of distributed vias and/or substructures containing hollow spaces in the stem material.

16. The apparatus of any of the previous embodiments, wherein said means of transducing said micromechanical disk comprises at least one electrode of conductive material, surrounding said micromechanical disk, and configured for receiving an alternating current and outputting an output current in response to time varying capacitance between said micromechanical disk and said at least one electrode when said micromechanical disk resonates.

17. A micromechanical disk resonator apparatus, comprising: a base layer; a micromechanical disk of a resonant material that is conductive; a stem mechanically anchoring the center of said micromechanical disk to said base layer and adapted for receiving a bias voltage; said stem being hollow to suppress resonant energy losses; and at least one electrode of conductive material surrounding the periphery of said micromechanical disk for receiving an alternating current, and outputting an output current in response to time varying capacitance between said micromechanical disk and said at least one electrode when said micromechanical disk resonates.

18. The apparatus of any of the previous embodiments, wherein said stem is hollow in response to having an outer thickness of material surrounding a hollow, which is devoid of solid material.

19. The apparatus of any of the previous embodiments, wherein said stem is hollow in response to having a plurality of distributed vias and/or substructures containing hollow spaces in the stem material.

20. The apparatus of any of the previous embodiments, wherein said micromechanical disk resonator apparatus operates as a capacitive transducer that is excited into resonance in response to a combination of a direct current (DC) bias voltage applied to the conductive disk in relation to an alternating current (AC) voltage applied to said at least one electrode.

21. The apparatus of any of the previous embodiments, wherein said micromechanical disk comprises polysilicon, oxide, metals, aluminum nitride (AlN) material.

22. The apparatus of any of the previous embodiments, wherein said at least one electrode comprises a polysilicon material.

23. The apparatus of any of the previous embodiments, wherein said micromechanical disk resonator apparatus is configured to resonant at modes selected from the group of mechanically resonant modes consisting of contour mode, wine glass mode, third order whispering gallery mode and sixth order whispering gallery mode.

24. The apparatus of any of the previous embodiments, wherein sufficient gap exists between said at least one electrode and said micromechanical disk to prevent contact between them during operation.

25. The apparatus of any of the previous embodiments, wherein said gap is on the order of 80 nanometers.

26. The apparatus of any of the previous embodiments, wherein said at least one electrode is curved toward preventing collapse at high voltages.

27. The apparatus of any of the previous embodiments, wherein said at least one electrode is fabricated over a structural spine to increase structural strength.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A mechanical resonator apparatus, comprising:
a base layer;
a mechanical structure with a resonance frequency; and
a stem which anchors and supports said mechanical structure on said base;
said stem being hollow to suppress resonant energy losses;
wherein said mechanical resonator is a micromechanical disk resonator.

2. A mechanical resonator apparatus, comprising:
a base layer;
a mechanical structure with a resonance frequency; and
a stem which anchors and supports said mechanical structure on said base;
said stem being hollow to suppress resonant energy losses;
wherein said mechanical resonator is a micromechanical ring resonator.

3. A mechanical resonator apparatus, comprising:
a base layer;
a mechanical structure with a resonance frequency; and
a stem which anchors and supports said mechanical structure on said base;
said stem being hollow to suppress resonant energy losses;
wherein said mechanical resonator is a micromechanical resonator is a clamped beam resonator.

4. The apparatus recited in claim 1, wherein said mechanical resonator is capacitively transduced.

5. The apparatus recited in claim 1, wherein said mechanical resonator is piezoelectrically transduced.

6. The apparatus recited in claim 1, wherein said mechanical resonator is optomechanically transduced.

7. The apparatus recited in claim 1, wherein said stem is hollow in response to having an outer thickness of material surrounding a hollow, which is void of solid material.

8. A mechanical resonator apparatus, comprising:
a base layer;
a mechanical structure with a resonance frequency; and
a stem which anchors and supports said mechanical structure on said base;
said stem being hollow to suppress resonant energy losses;
wherein said stem is hollow in response to having a plurality of distributed vias and/or substructures containing hollow spaces in the stem.

9. A mechanical resonator apparatus, comprising:
a base layer;
a mechanical structure with a resonance frequency;
a stem which anchors and supports said mechanical structure on said base;
said stem being hollow to suppress resonant energy losses; and
supports connecting to one or more said stems, wherein said supports are open concave members or hollow closed structures.

10. A mechanical resonator apparatus, comprising:
a base layer;
a mechanical structure with a resonance frequency;
a stem which anchors and supports said mechanical structure on said base;
said stem being hollow to suppress resonant energy losses; and
supports connecting to one or more said stems, wherein said supports are hollow in response to having a plurality of distributed vias and/or substructures containing hollow spaces in the material of said support.

11. A micro-scale disk resonator apparatus, comprising:
a base layer;
a micromechanical disk of a resonant material;
a stem mechanically anchoring the center of said micromechanical disk to said base layer;
said stem being hollow to suppress resonant energy losses; and
means of transducing said micromechanical disk of a resonant material.

12. The apparatus recited in claim 11, wherein said stem is hollow in response to having an outer thickness of material surrounding a hollow, which is void of solid material.

13. The apparatus recited in claim 11, wherein said stem is hollow in response to having a plurality of distributed vias and/or substructures containing hollow spaces in the stem material.

14. The apparatus recited in claim 11, wherein said means of transducing said micromechanical disk comprises at least one electrode of conductive material, surrounding said micromechanical disk, and configured for receiving an alternating current and outputting an output current in response to time varying capacitance between said micromechanical disk and said at least one electrode when said micromechanical disk resonates.

15. A micromechanical disk resonator apparatus, comprising:
a base layer;
a micromechanical disk of a resonant material that is conductive;
a stem mechanically anchoring the center of said micromechanical disk to said base layer and adapted for receiving a bias voltage;

said stem being hollow to suppress resonant energy losses; and at least one electrode of conductive material surrounding the periphery of said micromechanical disk for receiving an alternating current, and outputting an output current in response to time varying capacitance between said micromechanical disk and said at least one electrode when said micromechanical disk resonates.

16. The apparatus recited in claim 15, wherein said stem is hollow in response to having an outer thickness of material surrounding a hollow, which is devoid of solid material.

17. The apparatus recited in claim 15, wherein said stem is hollow in response to having a plurality of distributed vias and/or substructures containing hollow spaces in the stem material.

18. The apparatus recited in claim 15, wherein said micromechanical disk resonator apparatus operates as a capacitive transducer that is excited into resonance in response to a combination of a direct current (DC) bias voltage applied to the conductive disk in relation to an alternating current (AC) voltage applied to said at least one electrode.

19. The apparatus recited in claim 15, wherein said micromechanical disk comprises a polysilicon, oxide, metal, or aluminum nitride (AlN) material.

20. The apparatus recited in claim 15, wherein said at least one electrode comprises a polysilicon material.

21. The apparatus recited in claim 15, wherein said micromechanical disk resonator apparatus is configured to resonant at modes selected from the group of mechanically resonant modes consisting of contour mode, wine glass mode, third order whispering gallery mode and sixth order whispering gallery mode.

22. The apparatus recited in claim 15, wherein sufficient gap exists between said at least one electrode and said micromechanical disk to prevent contact between them during operation.

23. The apparatus recited in claim 22, wherein said gap is on the order of 80 nanometers.

24. The apparatus recited in claim 15, wherein said at least one electrode is curved toward preventing collapse at high voltages.

25. The apparatus recited in claim 15, wherein said at least one electrode is fabricated over a structural spine to increase structural strength.

26. The apparatus recited in claim 2, wherein said mechanical resonator is capacitively transduced.

27. The apparatus recited in claim 2, wherein said mechanical resonator is piezoelectrically transduced.

28. The apparatus recited in claim 2, wherein said mechanical resonator is optomechanically transduced.

29. The apparatus recited in claim 2, wherein said stem is hollow in response to having an outer thickness of material surrounding a hollow, which is void of solid material.

30. The apparatus recited in claim 3, wherein said mechanical resonator is capacitively transduced.

31. The apparatus recited in claim 3, wherein said mechanical resonator is piezoelectrically transduced.

32. The apparatus recited in claim 3, wherein said mechanical resonator is optomechanically transduced.

33. The apparatus recited in claim 3, wherein said stem is hollow in response to having an outer thickness of material surrounding a hollow, which is void of solid material.

* * * * *